United States Patent

Gause

[15] 3,644,166

[45] Feb. 22, 1972

[54] OXIDE-FREE MULTILAYER COPPER CLAD LAMINATE

[72] Inventor: Smith A. Gause, Hampton, S.C.

[73] Assignee: Westinghouse Electric Corporation, Pittsburgh, Pa.

[22] Filed: Mar. 28, 1968

[21] Appl. No.: 716,819

[52] U.S. Cl. ....................161/89, 161/93, 161/151, 161/213, 161/219, 174/68.5

[51] Int. Cl. ....................H05k 1/00, B32b 15/08

[58] Field of Search ....................161/93, 184, 185, 186, 193, 161/206, 207, 151, 219, 89; 260/46.5, 78; 174/68.5

[56] References Cited

UNITED STATES PATENTS

| | | | |
|---|---|---|---|
| 3,526,544 | 9/1970 | Scala et al. | 174/120 X |
| 2,932,599 | 4/1960 | Dahlgren | 156/3 |
| 3,310,457 | 3/1967 | Trebilcock | 161/185 |
| 3,393,117 | 7/1968 | Zolg et al. | 161/185 X |
| 3,445,326 | 5/1969 | Hurst | 161/207 |
| 3,473,992 | 10/1969 | Martello et al | 161/93 X |

FOREIGN PATENTS OR APPLICATIONS

| | | | |
|---|---|---|---|
| 864,873 | 4/1961 | Great Britain | 174/68.5 |

*Primary Examiner*—Robert F. Burnett
*Assistant Examiner*—Roger L. May
*Attorney*—F. Shapoe and Alex Mich, Jr.

[57] ABSTRACT

A copper-clad laminate is made with a copper foil, an intermediate thin film of an amino-silane applied over the copper surface and layers of a resin impregnated support material. The amino-silane film uniformly covers the copper surface and prevents oxide transfer to the support material.

9 Claims, 1 Drawing Figure

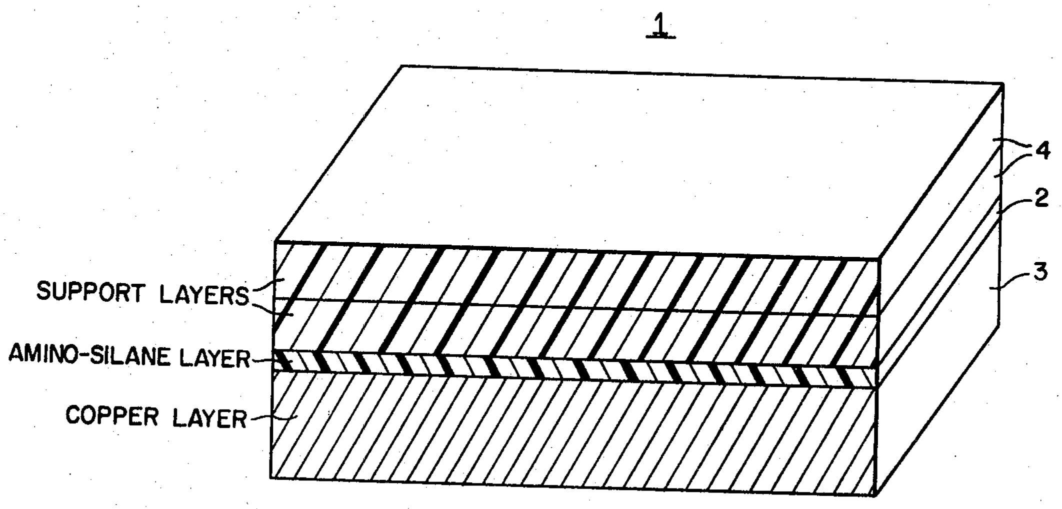
WITNESSES
Theodore F. Wrobel
Daniel P. Cillo
INVENTOR
Smith A. Gause
BY Alex Mich Jr.
ATTORNEY

OXIDE-FREE MULTILAYER COPPER CLAD LAMINATE

BACKGROUND OF THE INVENTION

This invention relates to a copper clad glass epoxy laminate for use in miniaturization of circuits and particularly to a treated copper foil sheet having an extremely thin oxidation resistant amino-silane film applied to it.

Conventional fabrication techniques of thin copper clad laminates start with a sheet of electrodeposited copper foil which has been treated with chemicals on the bonding side to improve adhesion to the support layer. This treatment results in copper oxides being incorporated and made part of the grain structure of the copper foil surface. Although this treatment improves bond strength and peel strength between copper and organic coatings, such coatings were adversely affected in that after removal of the unwanted copper, they exhibit discoloration, commonly termed "oxide transfer." This may actually be residual copper oxide, products of chemical reaction between the copper or copper oxide and one or more constituents of the organic coating or the result of some other physical or chemical reaction which is now undetermined.

This phenomenon may be present on any laminate or supporting layer but is especially objectional and more difficult to avoid on laminates of 2 to 30 mil thickness which are to be used in the manufacture of multilayered circuit boards. Many users of these materials require that the laminate support layer be visually free of "oxide transfer" after unwanted copper is removed by etching to form the desired copper pattern. Metal deposits on the copper foil have been somewhat successful but up to now, no resin formulations have been found to eliminate the "oxide transfer" which causes brown spotting and staining of the support material and which makes the entire product look defective.

SUMMARY OF THE INVENTION

Accordingly, it is the object of this invention to provide a copper clad thin laminate, the copper foil sheet being uniformly coated with a thin oxygen-resistant film to prevent oxidation of the metal surface and oxide transfer to the support material.

Briefly the present invention accomplishes the above-cited object by coating treated copper foil with a very thin film of an amino-silane such as gamma-aminopropyltriethoxy silane as an initial coating. The amino-silane film must completely coat the roughened copper surface so as to prevent oxide transfer to the organic support, oxidation of the copper foil and yet the film must be thin enough to still maximize the bond and peel strength of the treated copper foil. Of course the amino-silane film can be applied to nontreated copper foil and to any other conductor metals if oxidation problems exist with such metals.

BRIEF DESCRIPTION OF THE DRAWING

For a better understanding of the nature and objects of the invention, reference is made to the drawing, in which:

The single FIGURE is a fragmentary perspective view of a copper clad laminate of this invention.

DESCRIPTION OF THE PREFERRED EMBODIMENTS

As an illustration of the present invention reference is made to the drawing wherein the resinous film 2 for insulating the copper foil 3 of the copper clad laminate 1 from the support layers 4 must have a very low permeability to oxygen.

All plastic films are permeable to gases at varying rates. When the gas is oxygen and the temperature is increased, the rate of oxidation of a copper substrate increases accordingly as does the rate of oxygen permeability. Experimentation has shown however that a certain class of films when applied to treated copper substrates are extremely impermeable to oxygen gas at temperatures as high as about 325° C. and have a surface copper reaction product that is oxidatively stable.

These films which are in the thickness range of about 1.5 microns may be much thinner where more sophisticated coating techniques, such as the Langmuir technique disclosed in U.S. Pat. No. 2,220,860, are used provided a complete uniform film is applied. Such films are composed of a material such as a silane or low solvent soluble siloxane polymer comprising at least one aliphatic group having an amino group substituted thereon, for example such aliphatic groups as ethyl, propyl, butyl, and pentyl with an $NH_2$ group substituted thereon, or an amino group having an alkyl group replacing one hydrogen atom thereof.

More specifically the silane film consists of an amino substituted organo-silane having the general structure:

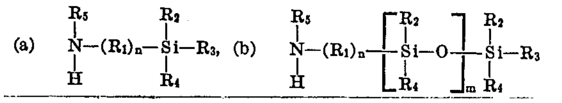

In the (a) structure above, the amino group would be attached directly to the silicon atom when $n$=0. $R_1$ represents an alkylene or alkylidene radical. $R_2$, $R_3$, and $R_4$ can represent a monovalent alkyl, alkoxy, aryl, aryloxy radical and amino substituted alkyl radicals. In the foregoing formulas, $n$ can be 0 or 1 and $m$ is from 0 to 25. $R_5$ is a hydrogen or alkyl group.

These nitrogen-containing compounds can exist in monomeric form as in (a) above. They can also be used in the polymeric form (b) by substituting a readily hydrolyzable group such as an OH group for any one of $R_2$, $R_3$, or $R_4$ of the appropriate monomer followed by condensation through the OH groups to produce the (b) polymer.

As an example, one of the nitrogen-containing compounds which has been found to impart these benefits effectively is gamma-aminopropyltriethoxysilane, having the following formula:

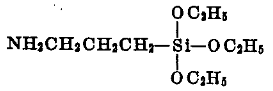

Other examples of the compounds for use in practicing the invention are:

(1)

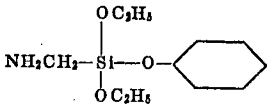

(2)

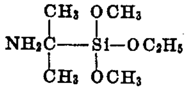

(3)

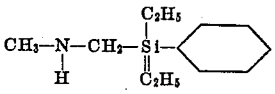

and (4)

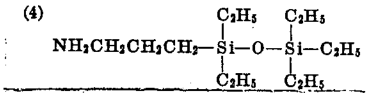

In example (3) the amino group is a secondary amine.

The specific structure of the alkyl group can be varied and the substituted $NH_2$ on any one of the carbon atoms of the $R_1$ group to give an alpha, beta, gamma, delta, etc., amino substituted compound. Moreover, an amino group can be substituted on more than one alkyl group, if present, and the amino group can be a primary or secondary type, as in (3) above, or combination thereof.

The preferred method for applying the amino-silane film is by means of a one-sided kiss coat on a horizontal treater. In this method the treated copper foil passes treated side down between two rolls situated one above the other. The bottom roll is partly immersed in the amino-silane solution and applies a uniform thin film to the bottom of the foil. Other methods such as dipping or spraying may be used. These methods however usually deposit film on both sides of the foil. This acts as a resist to the etching solutions to be used on the unbonded side of the copper. The kiss coat method seems to apply more pressure against the copper foil than the other methods. This forces the amino-silane solution into the pores of the roughened copper surface so that a better coating is applied. The preferred solution of amino-silane in water or other suitable solvent such as toluene is about 6.0 to about 11 percent when using the dip method and about 1 to 10 percent when kiss coating. Below this range there tends to be oxide transfer because the amino-silane does not uniformly cover the rough surface and above it the bonding qualities of the copper oxide surface treatment begin to rapidly decline and there exists the possibility of separation or peeling of the support layer from the copper foil.

The support layer 4 shown may consist of any of the following: glycidyl polyether (epoxy resin), polyimide (such as set forth in U.S. Pat. No. 3,179,634), or polyamide-imide (such as set forth in U.S. Pat. No. 3,179,635) resin laminates. The resins are impregnated into glass cloth or other suitable fibrous or fabric backing sheets such as asbestos, polyacrylate or polyester. The thickness of the support layer 4 may vary from about 1 mil to 250 mils depending on the end use. Layers of copper clad laminates may also be stacked one upon another. Glass cloth epoxy resin laminates, about 1 to 10 mils thick, are preferred as the support for the copper foil.

EXAMPLE I

A laminate was made from (0.0028 inches × 12 inches × 12 inches) copper foil coated with amino-silane and supported by a glass-epoxy substrate. This particular foil was manufactured by an electro deposition method which left it with one side roughened. This roughened side is chemically treated to provide a copper oxide finish to promote adhesion of epoxy coatings. Such treatments are well known in the art and foil so treated is readily available.

A very thin coat (film) of gamma-aminopropyltriethoxy silane (sold by Union Carbide under the proprietary designation amino-silane A–1100), was applied to the bondable treated side of the copper foil by dipping in a 1 percent solution of the amino-silane in water. The amino-silane coating was then allowed to air dry. The coated copper foil was then bonded to two sheets of a glass cloth support impregnated with a chemical resistant epoxy resin described hereinafter in a press held at 1,000 p.s.i. for 30 minutes at 160° to 180° C.

The glass cloth had an approximate weight of 3.16 ounces per square yard; a thickness of 4 mils; a thread count of 60 in the warp and 50 in the fill direction, and a plain weave.

The epoxy varnish used to impregnate the glass cloth was prepared as follows: (1) dissolve 0.9 pounds dicyandiamide in 8 pounds methyl Cellosolve (2-methoxy ethanol in a clean vessel previously rinsed with methyl Cellosolve; (2) add 17 pounds of a 75 percent solids solution of a low melting diglycidyl ether of bisphenol A having an epoxy equivalent weight of 475–525 (sold by Dow Chemical Company under the trademark DER 661 PR), to 15 pounds of a polyglycidyl ether of phenol formaldehyde novolac supplied at 80 percent, solids in acetone (by Dow Chemical Company under the trademark DEN–438 A–85) having an epoxy equivalent weight of 176–181 based on solids; (3) mix until uniform; (4) hold the batch until approximately 2 hours before treatment is to start; (5) add about 22 grams benzyl dimethylamine as catalyst; and (6) mix until uniform.

In the resultant laminate oxide transfer was found to be very objectionable.

EXAMPLE II

This example includes four experiments using the same methods and materials as above. The copper foil was dipped in 2, 3, 4 and 5 percent solutions of gamma-aminopropyltriethoxysilane in water. The resultant glass epoxy multilayer copper clad laminate had no actual "brown spots" on the organic support. Slight shadows were present however which were believed to be a very faint form of oxide transfer.

EXAMPLE III

Here the same methods and materials were used as in Example I but the copper foil was not dipped in any amino-silane solution. The resultant laminate had very objectionable oxide transfer on the organic support.

EXAMPLE IV

When a 10 percent solution of gamma-aminopropyltriethoxy silane in water was used, materials and methods being the same as in Example I, the resultant glass epoxy multilayer copper clad laminate had no oxide transfer or shadows present at all indicating that at this solution in the dip process a uniform coating of amino-silane was applied on the rough copper surface.

EXAMPLE V

In this example the same materials were used as in Example I but the amino-silane was applied at two different concentrations by means of a kiss coat on a horizontal treater. The copper foil was moved treated face down between two rollers. The bottom roller was immersed in a 6½ percent solution of amino-silane in water in one case and in a 1 percent solution in another case. The speed was 40 inches/min. and the amino-silane was applied only to the facedown copper treated surface. The resultant glass epoxy multilayer copper clad using this treated foil had no oxide transfer in either case. As in the dipping method the film applied to the copper should air dry before the copper is bonded to the double glass epoxy support or otherwise disturbed. It would appear that any amino-functional silane would work. It seems that in this method of application the solution is forced into the pores of the treated foil so that a less concentrated solution is necessary for a uniform coating.

While there have been shown and described what are at present considered to be the preferred embodiments of this invention, modifications thereto will readily occur to those skilled in the art. It is not desired therefore that the invention be limited to the specific arrangements, embodiments and methods shown and described and it is intended to cover in the appended claims all such modifications as fall within the true spirit and scope of the invention.

I claim:

1. A copper clad laminate comprising copper foil having a copper oxide surface, an intermediate thin oxygen impermeable film uniformly covering the copper oxide foil surface, said film being up to about 1.5 microns thick and selected from the group consisting of an amino organo-silane and a low solvent soluble siloxane polymer, the silane and siloxane comprising at least one aliphatic group in each molecule having an amino group substituted thereon, and a resin impregnated, fibrous support member contacting the oxygen impermeable film.

2. The laminate of claim 1 wherein the copper foil has a rough bondable treated surface.

3. The laminate of claim 2 in which the support member comprises an organic resin selected from the group consisting of glycidyl polyether, polyimide and polyamide-imide resins, and a backing sheet of fibers, selected from the group consisting of asbestos, glass, polyacrylate and polyester fibers is impregnated with resin.

4. The laminate of claim 3 wherein the support member is open weave glass cloth impregnated with a glycidyl polyether resin.

5. The laminate of claim 2 wherein the intermediate thin film is gamma-aminopropyltriethoxysilane.

6. A copper clad laminate consisting essentially of a copper foil having a rough, bondable, treated surface with a copper oxide, porous grain structure, an intermediate thin oxygen impermeable film uniformly covering the grain structure and filling the pores of the bondable treated copper foil surface, said film consisting of an amino substituted organo-silane, and a resin impregnated, fibrous support member contacting the oxygen impermeable film, said film preventing oxide transfer from the foil to the resin impregnated fibrous support.

7. The laminate of claim 6 in which the support member comprises an organic resin selected from the group consisting of glycidyl polyether, polyimide, and polyamide-imide resins, and a backing sheet of fibers, selected from the group consisting of asbestos, glass, polyacrylate, and polyester fibers, said fibers impregnated with resin.

8. The laminate of claim 7 wherein the intermediate oxygen impermeable thin film is a gamma-aminopropyltriethoxy silane film.

9. The laminate of claim 7 wherein the oxygen impermeable film is up to about 1.5 microns thick.

* * * * *